United States Patent [19]

Sano et al.

[11] Patent Number: 5,254,948
[45] Date of Patent: * Oct. 19, 1993

[54] METHOD AND APPARATUS FOR BODY MOTION CORRECTIVE IMAGING

[75] Inventors: Koichi Sano, Sagamihara; Tetsuo Yokoyama, Tokyo; Hideaki Koizumi, Katsuta, all of Japan

[73] Assignee: Hitachi, Ltd., Tokyo, Japan

[*] Notice: The portion of the term of this patent subsequent to Jun. 11, 2008 has been disclaimed.

[21] Appl. No.: 660,084

[22] Filed: Feb. 25, 1991

Related U.S. Application Data

[63] Continuation of Ser. No. 330,835, Mar. 30, 1989, Pat. No. 5,023,553.

[30] Foreign Application Priority Data

Apr. 1, 1988 [JP] Japan .................................. 63-78007

[51] Int. Cl.$^5$ ............................................. G01V 3/00
[52] U.S. Cl. ................................... 324/309; 324/307
[58] Field of Search ............ 324/309, 307, 312, 653.2, 324/300, 310, 314

[56] References Cited

U.S. PATENT DOCUMENTS 4,937,526  6/1990  Ehman et al. ...................... 324/309
5,023,553  6/1991  Sano et al. ........................ 324/309

*Primary Examiner*—Louis Arana
*Attorney, Agent, or Firm*—Pennie & Edmonds

[57] ABSTRACT

In order to eliminate the degradation of NMR image caused by a body motion due to breathing or the like, one of measured image signals is selected as a reference, correlation is calculated between each measured image signal and the reference, and the image signal is modified on the basis of the value of correlation.

12 Claims, 4 Drawing Sheets

ABDOMINAL PART → PROJECTION → PROJECTION DATA 400 f(x,n)
n-TH PROJECTION DATA g(x)
REFERENCE DATA

METHOD AND APPARATUS FOR BODY MOTION CORRECTIVE IMAGING

This is a continuation of application Ser. No. 07/330,835, filed Mar. 30, 1989, now U.S. Pat. No. 5,023,553.

BACKGROUND OF THE INVENTION

This invention relates to a method and apparatus of NMR imaging, namely a method of tomography utilizing the NMR phenomenon, and particularly to a method and apparatus for imaging with the intention of eliminating the influence of respiratory motion.

An NMR imaging apparatus takes 2-20 minutes for taking an image, and imaging of thoraxic and abdominal parts is influenced by breathing, resulting in blurring and artifact of image. For overcoming this problem, there are two (or in more fine classification three) approaches. One is to reduce the repetition time of imaging so that imaging completes within a time length in which the patient can hold breathing. However, this method has a problem of different quality of image from the case of usual imaging with a longer repetition time, due to the influence of relaxation time of spin. The second approach, which eliminates the influence of breathing while expending an equal repetition time employs a means of synchronization or modification of measured data through the detection of respiratory motion. The method of synchronization through the detection of respiratory motion unfavorably involves complicated control and extended measuring time, whereas the method of modification of measured data can readily be carried out on a software basis without any prolongment of measuring time. The method of measured data modification by detecting the respiratory motion is discussed in the proceeding of SMRM (1985), pp. 962-963.

In measuring the NMR signal, an image measurement signal is produced from the first echo signal, and a projection data measurement signal is produced from the second echo signal. The Fourier transformation for the second echo signal yields projection data 400 shown in FIG. 4. By detecting the edge portion (b) 402 or (c) 403 of the projection data, the state of breathing is known. The respiratory motion is defined between the edge portion and the highest point a among quiescent points whose positions do not move conceivably. It is conceived that the respiratory motion is a linear expansion and contraction, and the image measurement signal is subjected to such a linear transformation.

Although the foregoihg prior art assumes that the motion in the body caused by breathing is a linear expansion and contraction between the quiescent point and edge portion, the actual respiratory motion in the abdominal part is not necessarily a linear expansion and contraction, and this method for motion modification can do little for eliminating the degradation of image quality attributable to breathing.

SUMMARY OF THE INVENTION

An object of this invention is to eliminate the degradation of image quality attributable to breathing by evaluating accurately the amount of motion of each part of body on the basis of projection data and modifying measured data.

The above objective is achieved based on the fact that when the projection data ignores the respiratory motion, the same data is obtained at each measurement. One projection data is selected as a reference (will be termed "reference data"), and the correlation is taken between the reference data and each projection data.

Reference data is expressed as $g(x)$ and projection data of the n-th measurement is expressed as $f(x,n)$ (see FIG. 5). The correlation function near point X of the n-th projection data is defined as follows.

$$R(X = \Delta x, n) = \frac{1}{2a} \int_{x-a}^{x+a} g(x)f(x + \Delta x, n)dx \quad (1)$$

where $a$ is the range in which correlation is taken, and $\Delta x$ is the value of displacement at a corresponding point.

At this time, there exists for X and n a value $\Delta x_{max}$ of which meets $\max R(X + \Delta x, n)$. The value $\Delta x_{max}$ is shown as follows.

$$Shift\ (X,n) = \Delta X_{max} \quad (2)$$

The value of formula (2) indicates that the point X of the n-th projection data is offset from the point X of the reference data by the amount of Shift $(X,n)$. Namely, by evaluating values of formula (2) for all X and n, the positional difference between the position of point X of each measured data and the position of the reference data can be obtained. Accordingly, the amount of respiratory motion can be inferred from the above, and this value is used to modify the image measurement signal.

With the n-th measured signal being expressed as $S(w_x, n)$, the Fourier transformed signal $h(x,n)$ and $f(x,n)$ are in one-to-one correspondence for the $w_x$, and based on the value of formula (2), the $h(x,y)$ is modified as follows.

$$h(x,n) = h(x+shift(x,n),n) \quad (3)$$

The formula (3) is executed for all values of n and finally the Fourier transformation process is conducted for n, and an image modified for motion is obtained. In evaluating the value of $\Delta x$, it is not necessary to examine the whole range, but an examination range of $-1 \leq \Delta x \leq 5$ is enough since the variation is slow locally.

BRIEF DESCRIPTION THE DRAWINGS

DESCRIPTION OF THE PREFERRED EMBODIMENTS

Figure 2:
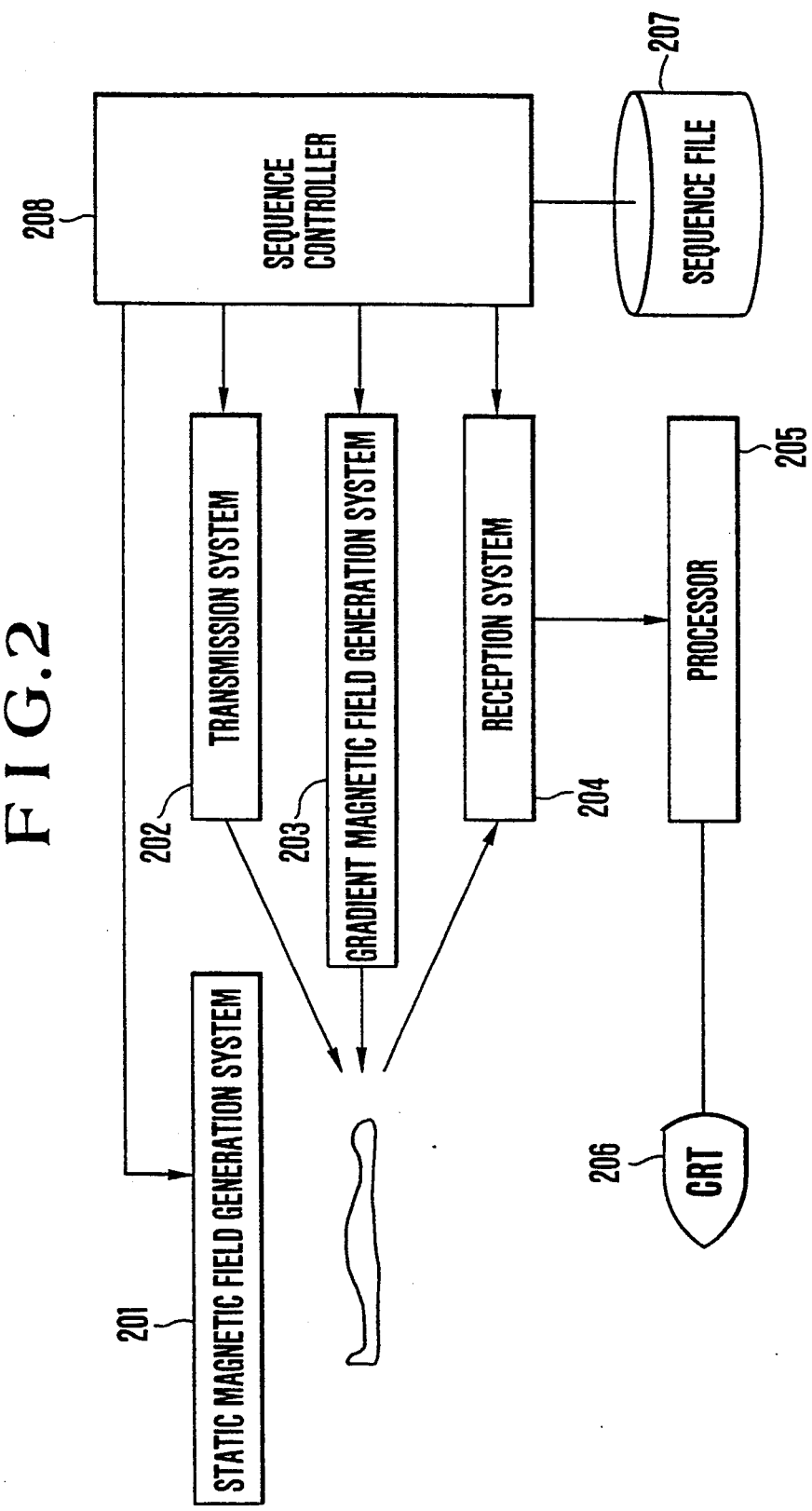
FIG. 2 is a block diagram showing an embodiment of this invention.

An embodiment of this invention will be described in detail. FIG. 2 is a block diagram showing an embodiment of this invention. The embodiment comprises a static magnetic field generation system 201 for generating a uniform static magnetic field, a transmission system 202 which generates high-frequency pulses for spin excitation, a gradient magnetic field generation system 203 which is operative to vary the magnetic field strength linearly in the x, y and z directions independently, a reception system 204 which receives an electromagnetic wave generated by a body under test and performs A/D conversion for the received signal following the detection, a processor 205 which evaluates the modification parameter based on the measured data from the reception system and implements various computations including the modification process necessary for the image reproduction, a CRT 206 which displays the reproduction result, a pulse sequence file 20 which stores the operational control procedures of the above systems, and a sequence controller 208 which controls the operational timing of the above systems.

Figure 3:
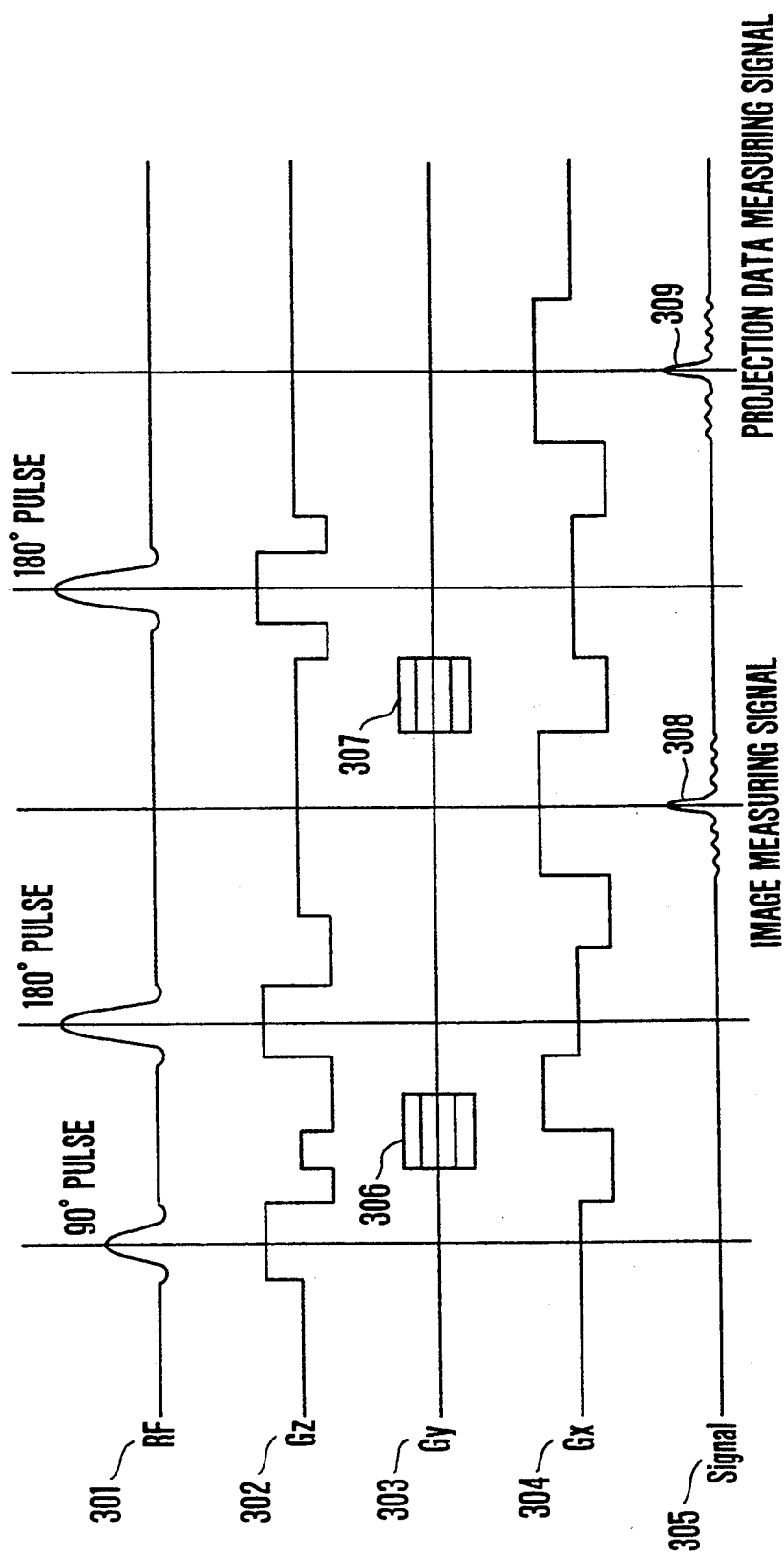
FIG. 3 is a pulse sequence diagram showing an example of projection procedure according to this invention.
Figure 4:
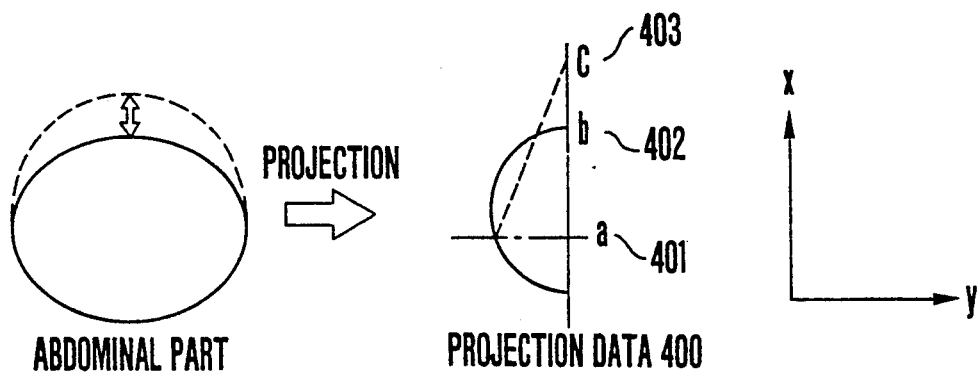
FIG. 4 is a diagram used to explain the motion of projection data.
Figure 5:
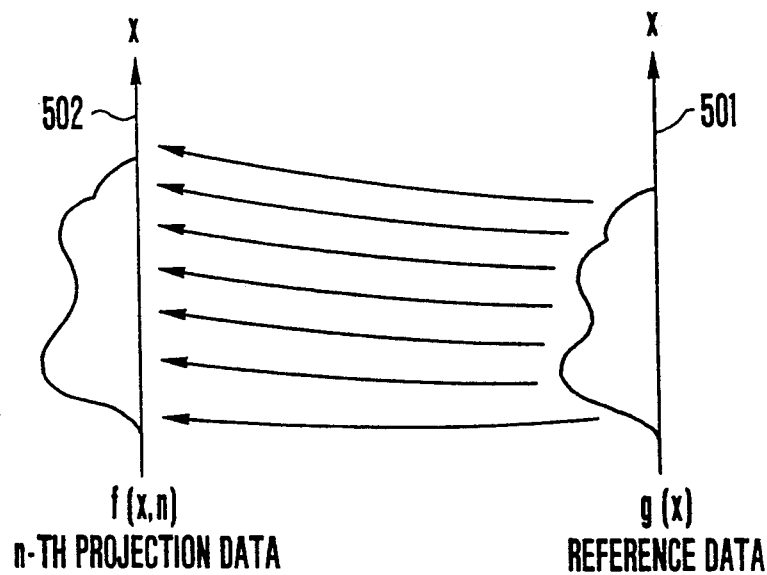
FIG. 5 is a diagram showing the relation between reference data and projection data.

FIG. 3 shows an example of pulse sequence according to this invention. The sequence is stored in the sequence file 207 in advance, and it provides operational timing information for the sequence controller 208. RF 301 is the application timing of high-frequency pulses generated by the transmitter 202, Gz 302, Gy 303 and Gx 304 are the application timings of the gradient magnetic fields in the z, y and x directions, and signal 305 is the measurement timing for the measurement signal 307.

The RF 301 and Gz 302 are for the selection of a slicing plane in the specific Z direction, the Gy 303 is for the positional separation in the y direction, and the Gx 304 is for the positional separation in the x direction. At this time, the separation in the y direction cannot be done once, and the application of Gy is to measure the measurement signal 308 a plurality of number of times by varying the amplitude at each measurement, as shown by the gradient magnetic field 306. Typically, the measurement takes place 256 times.

Although, the operation normally terminates at the observation of the measurement signal 308, this invention necessitates the projection data for the observation of the abdominal part at the time of measurement of this signal. On this account, a magnetic field 307 which cancels the influence of the gradient magnetic field 306 is applied thereby to obtain the measurement signal 309 which is the second echo.

Figure 1:
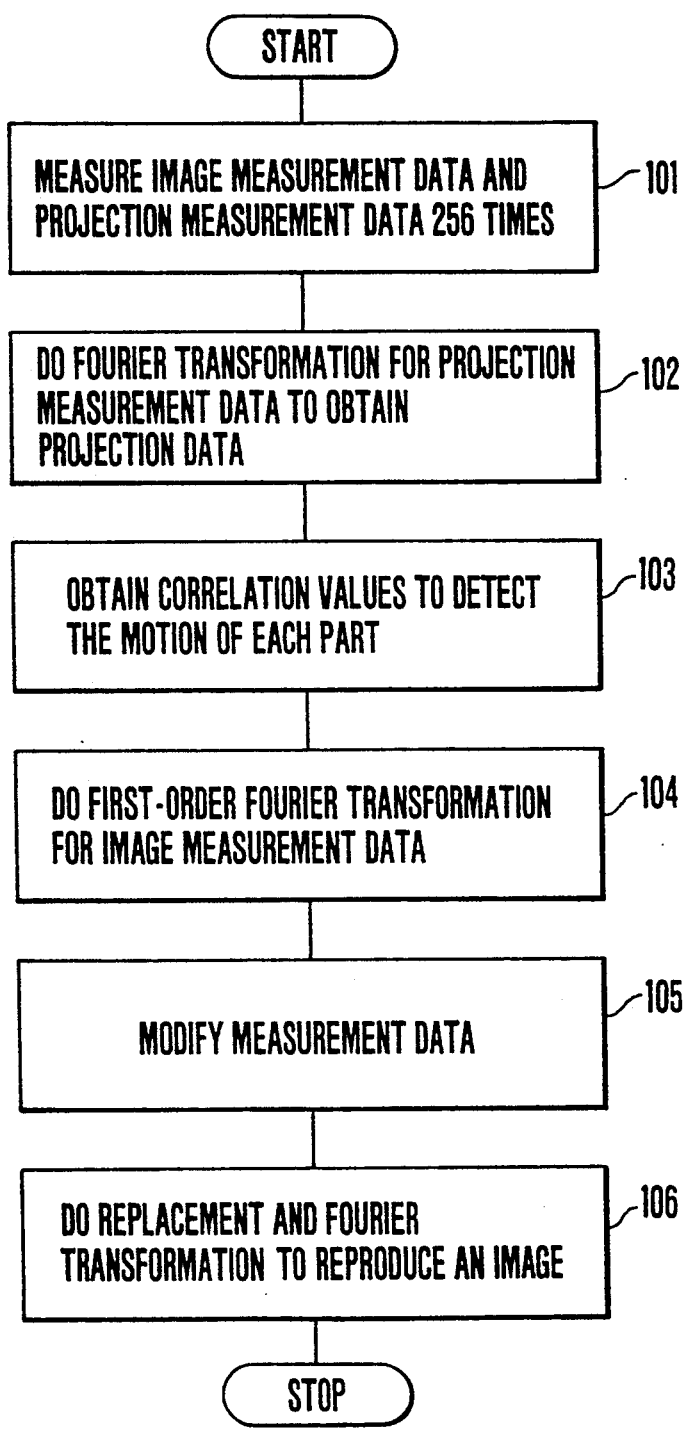
FIG. 1 is a flowchart showing the procedure of process according to this invention.

The following describes the operation in more detail with reference to the flowchart of FIG. 1.

Step 101: Measures the image measurement data 308 and projection measurement data 309 by varying the phase-encoded gradient magnetic fields Gy 306 and 307 256 times in accordance with the pulse sequence of FIG. 3. The n-th image measurement data is $S(w_x,n)$ and projection measurement data is $P(w_x,n)$.

Step 102: Implements Fourier transformation of the projection measurement data $P(w_x,n)$ for $w_x$ to obtain projection data $f(x,n)$.

$$F[P(w_x,n)] = f(x,n), \text{ for all } n \quad (4)$$

where F is Fourier transformation.

Step 103: Selects a specific k-th data $f(x,k)$ from the projection data $f(x,n)$, which is called "reference data $g(x)$". Between the $g(x)$ and $f(x,n)$, the correlation based on the formula (1) is calculated for each X and n by varying $\Delta x$. For each X and n, a table of values of $\Delta x_{max}$ which make values of formula (1) maximum is produced as shown by the formula (2). The table shows the amount of motion at point x of each projection data.

Step 104: Performs Fourier transformation of image measurement data $S(w_x,n)$ for $w_x$ to obtain the following $h(x,n)$.

$$h(x,n) = F[S(w_x,n)], \text{ for all } n \quad (5)$$

Step 105: Modifies the h(x,y) based on the values of table of formula (2) as follows.

$$h(x,n) = h(x+shift(x,n),n), \text{ for all } n \quad (6)$$

Step 106: Inplements Fourier transformation of the modified signal h(x,y) for n to obtain an image signal M(x,y) as follows.

$$M(x,y) = Fn]h(x,y)], \text{ for all } x \quad (7)$$

According to this invention, the displacement caused by the respiratory motion can be modified, and the deterioration of image (artifact and blurring) due to motion can be reduced significantly, and a high-quality image can be obtained.

What is claimed is:

1. A body motion corrective imaging method comprising the steps of:
    generating a static magnetic field, a gradient magnetic field and a high-frequency magnetic field;
    measuring a Nuclear Magnetic Resonance (NMR) data from an object under examination to which said magnetic fields are applied;
    computing an intermediate data by one-dimensional Fourier transformation from said NMR data;
    computing an amount of motion of projection data at each point of said intermediate data on the basis of correlation between said intermediate data;
    modifying said NMR data on the basis of said amount of the motion of said projection data; and
    reconstructing an image of said object from said modified data.

2. The body motion corrective imaging method as recited in claim 1 wherein said NMR data includes an image signal measurement data and a projection measurement data.

3. The body motion corrective imaging method as recited in claim 2 wherein said image signal measurement data is modified on the basis of said amount of motion of said projection data.

4. In an imaging system which measures an NMR data, a method for body motion corrective imaging comprising the steps of:
    transforming an NMR data acquired by the imaging system to create an intermediate data by performing a Fourier transformation on the NMR data along one of its dimensions:
    producing a movement data table using the intermediate data by correlating each row of the intermediate data to produce a corresponding shift value for the movement data table of projection data;
    applying the data in the movement data table to NMR data measured by the imaging system to reduce artifacts caused by motion in the acquired NMR data; and
    producing an image of an object to be inspected from the reduced NMR data.

5. The body motion corrective imaging method as recited in claim 4 wherein said applying step includes a step of performing a Fourier transformation on said NMR data along one of its dimensions.

6. The body motion corrective imaging method as recited in claim 5 wherein the NMR data to create said intermediate data is a projection measurement data.

7. The body motion corrective imaging method as recited in claim 6 wherein each of said projection measurement data is acquired in the same pulse sequence with its corresponding NMR data.

8. A body motion corrective imaging apparatus comprising:
- a means for generating a static magnetic field, a gradient magnetic field and a high-frequency magnetic field;
- means for measuring an NMR data from an object under examination to which said magnetic fields are applied;
- means for computing an intermediate data by one-dimensional Fourier transformation from said NMR data;
- means for computing an amount of motion of projection data at each point of said intermediate data on the basis of correlation between said intermediate data;
- means for modifying said NMR data on the basis of said amount of the motion; and
- means for reconstructing an image of said object from said modified data.

9. A body motion corrective imaging apparatus for an NMR imaging system, said apparatus comprising:
- means for transforming an NMR data acquired to create an intermediate data by performing a Fourier transformation on the NMR data along one of its dimensions:
- means for producing a movement data table of projection data by using the intermediate data by correlating each row of the intermediate data to produce a corresponding shift value for the movement data table;
- means for applying the data in the movement data table to an NMR data measured to reduce artifacts caused by motion in the acquired NMR data; and
- means for producing an image of an object to be inspected from the reduced NMR data.

10. The apparatus as recited in claim 9 in which said applying means includes means for performing a Fourier transformation on said NMR data along one of its dimensions.

11. The apparatus as recited in claim 9 wherein the NMR data to create said intermediate data is a projection measurement data.

12. The apparatus as recited in claim 11 wherein each of said projection measurement data is acquired in the same pulse sequence with its corresponding NMR data.

* * * * *